(12) United States Patent  
Seddon et al.

(10) Patent No.: US 12,040,295 B2
(45) Date of Patent: Jul. 16, 2024

(54) SEMICONDUCTOR DEVICE WITH BACKMETAL AND RELATED METHODS

(71) Applicant: SEMICONDUCTOR COMPONENTS INDUSTRIES, LLC, Phoenix, AZ (US)

(72) Inventors: Michael J. Seddon, Gilbert, AZ (US); Takashi Noma, Ota (JP); Kazuo Okada, Ota (JP); Hideaki Yoshimi, Oura-gun (JP); Naoyuki Yomoda, Sakata (JP); Yusheng Lin, Phoenix, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 225 days.

(21) Appl. No.: 17/320,495

(22) Filed: May 14, 2021

(65) Prior Publication Data

US 2021/0272920 A1 Sep. 2, 2021

Related U.S. Application Data

(62) Division of application No. 15/903,677, filed on Feb. 23, 2018, now Pat. No. 11,114,402.

(51) Int. Cl.
*H01L 23/00* (2006.01)
*H01L 21/78* (2006.01)
*H01L 23/498* (2006.01)

(52) U.S. Cl.
CPC .............. *H01L 24/10* (2013.01); *H01L 21/78* (2013.01); *H01L 23/49811* (2013.01); *H01L 24/95* (2013.01)

(58) Field of Classification Search
None
See application file for complete search history.

(56) References Cited

U.S. PATENT DOCUMENTS

| 9,196,534 | B2 | 11/2015 | Xue et al. | |
| 9,640,497 | B1 | 5/2017 | Lin et al. | |
| 2004/0063268 | A1 | 4/2004 | Noma et al. | |
| 2004/0229445 | A1 | 11/2004 | Suzuki et al. | |
| 2008/0242052 | A1* | 10/2008 | Feng | H01L 21/3043 438/459 |
| 2010/0102460 | A1* | 4/2010 | Tomita | H01L 21/76898 257/E21.59 |
| 2013/0032952 | A1* | 2/2013 | Cho | H01L 25/03 257/777 |
| 2014/0242756 | A1 | 8/2014 | Xue et al. | |
| 2014/0315350 | A1* | 10/2014 | Xue | H01L 24/11 438/110 |

(Continued)

FOREIGN PATENT DOCUMENTS

JP 2008098529 4/2008
JP 2008153279 A 7/2008

(Continued)

*Primary Examiner* — Sarah K Salerno
(74) *Attorney, Agent, or Firm* — Adam R. Stephenson, LTD.

(57) ABSTRACT

Implementations of semiconductor devices may include a die having a first side and a second side, a contact pad coupled to the first side of the die, and a metal layer coupled to the second side of the die. A thickness of the die may be no more than four times a thickness of the metal layer.

20 Claims, 13 Drawing Sheets

(56) References Cited

U.S. PATENT DOCUMENTS

2016/0071788 A1\* 3/2016 Lohia ............... H01L 23/49503
257/676

FOREIGN PATENT DOCUMENTS

| JP | 2010118573 | | 5/2010 |
|----|------------|---|--------|
| JP | 2012182239 | A | 9/2012 |
| JP | 2017085122 | A | 5/2017 |

\* cited by examiner

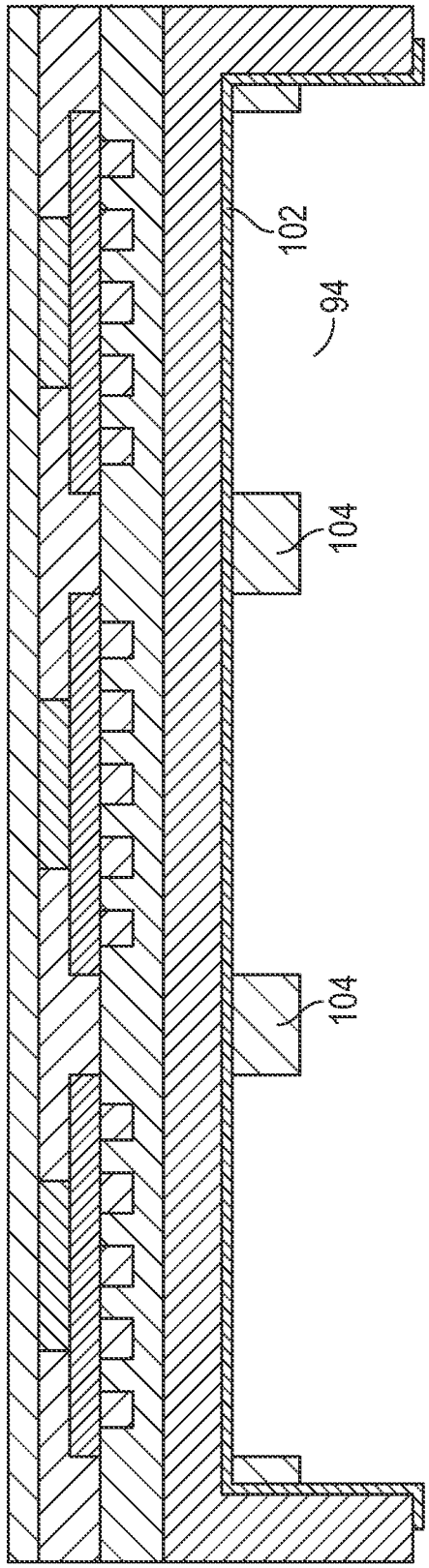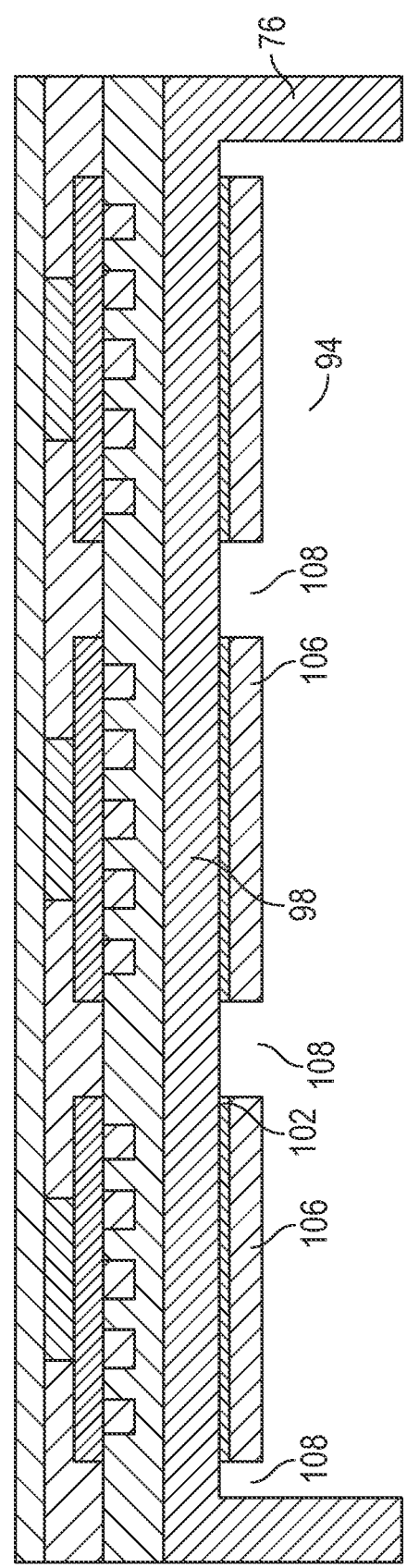

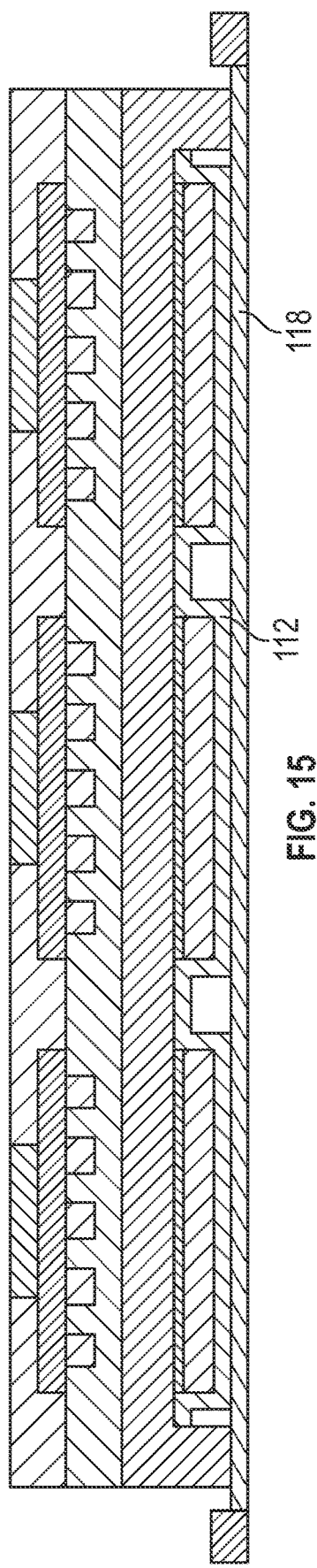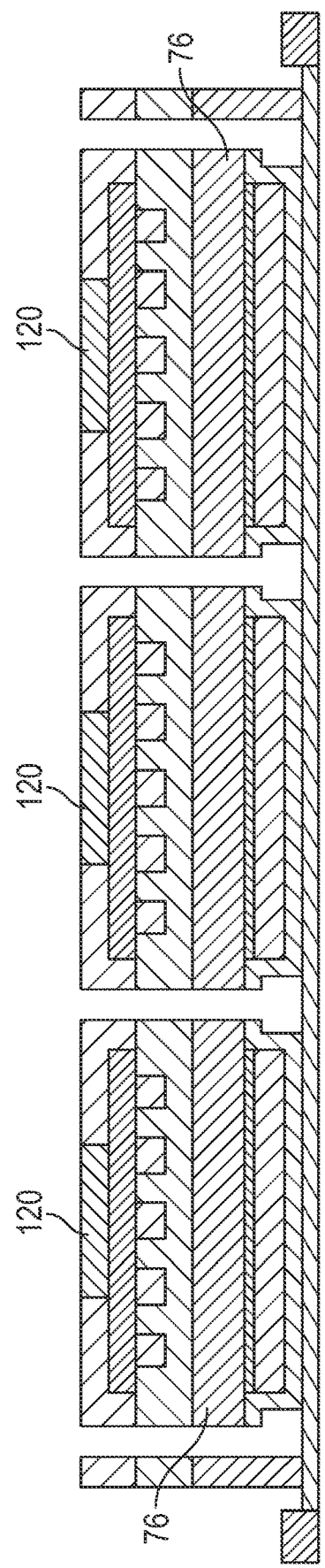

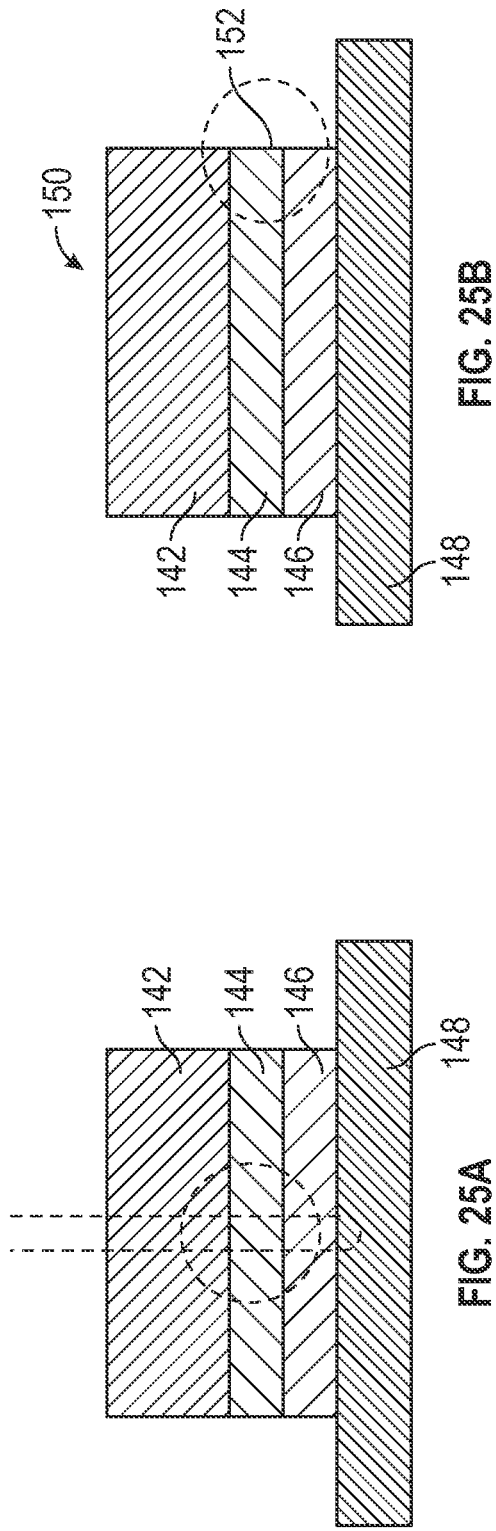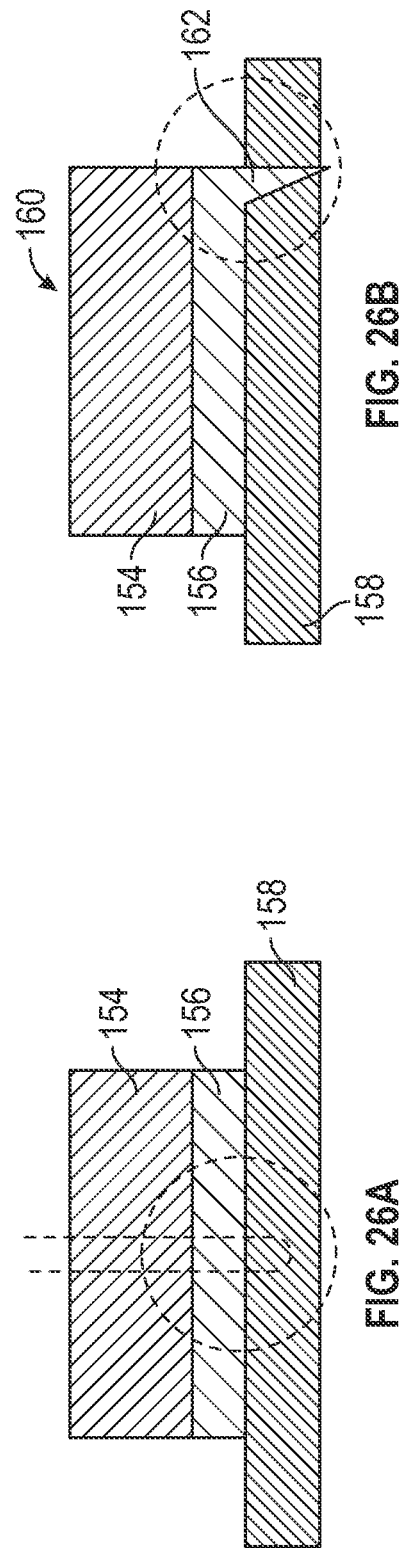

SEMICONDUCTOR DEVICE WITH BACKMETAL AND RELATED METHODS

CROSS REFERENCE TO RELATED APPLICATIONS

This application is a divisional application of the earlier U.S. Utility Patent Application to Seddon entitled "Semiconductor Device with Backmetal and Related Methods," application Ser. No. 15/903,677, filed Feb. 23, 2018, now pending, the disclosure of which is hereby incorporated entirely herein by reference.

BACKGROUND

1. Technical Field

Aspects of this document relate generally to semiconductor devices and semiconductor wafer and device processing methods.

2. Background

Semiconductor fabrication processes may involve many steps. In some processes a wafer receives one or more layers, such as electrically conductive layers. Electrically conductive layers may be used to provide electrical contact areas of individual semiconductor devices singulated from the wafer. Electrically conductive layers are often formed using sputtering, evaporation, or electroplating operations.

SUMMARY

Implementations of semiconductor devices may include a die having a first side and a second side, a contact pad coupled to the first side of the die, and a metal layer coupled to the second side of the die. A thickness of the die may be no more than four times a thickness of the metal layer.

Implementations of semiconductor devices may include one, all, or any of the following:

The die may be less than 30 micrometers (um) thick.

The thickness of the die may be substantially the same as the thickness of the metal layer.

The device may include a mold compound directly coupled to the metal layer.

The device may include a mold compound directly coupled over the metal layer.

Implementations of semiconductor devices may include a die having a first side and a second side, a contact pad coupled to the first side of the die, a metal layer coupled to the second side of the die, and a mold compound coupled directly to the metal layer. A thickness of the die may be less than 30 um.

Implementations of semiconductor devices may include one, all, or any of the following:

The thickness of the die may be substantially the same as the thickness of the metal layer.

The mold compound may be coupled directly over the metal layer.

Implementations of a method for forming a semiconductor die may include forming a plurality of contact pads coupled to a first side of a wafer, forming a recess in a second side of the wafer opposite the first side through backgrinding the wafer, forming a metal layer within the recess, patterning the metal layer within the recess, and singulating the wafer into a plurality of semiconductor devices.

Implementations of methods for forming semiconductor devices may include one, all, or any of the following:

The method may include coupling a mold compound with the metal layer within the recess.

The metal layer may be exposed through the mold compound.

The mold compound may be directly coupled over the metal layer.

The method may include backgrinding a portion of the wafer until the portion of the wafer is coplanar with a plane formed by a portion of the mold compound.

The method may include thinning the wafer through forming the recess, wherein a portion of the wafer is thinned to less than 30 um.

The method may include coating the recess with a seed layer.

The method may include forming a plurality of bumps over the metal layer.

The method may include coupling one of the metal layer, a mold compound, and a plurality of bumps to a backside protection layer prior to singulating the wafer.

Implementations of a method for forming a semiconductor die may include forming a plurality of contact pads coupled to a first side of a wafer, forming a recess in a second side of the wafer opposite the first side through backgrinding the second side of the wafer, forming a metal layer within the recess, forming a plurality of openings within the metal layer, forming a mold compound into the openings of the metal layer, and singulating the wafer into a plurality of semiconductor devices.

Implementations of methods for forming semiconductor devices may include one, all, or any of the following:

The method may also include forming a metal layer between the contact pad and the first side of the wafer.

A thickness of the metal layer may be substantially the same as a thickness of the wafer.

A thickness of the metal layer may be substantially three times a thickness of the wafer.

The method may include coupling a second metal layer over the metal layer.

The mold compound may encapsulate the metal layer.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 11 is a cross-section side view of the wafer of FIG. 10 with a mask formed in the recess;

FIG. 12 is a cross-section side view of the wafer of FIG. 10 with a metal layer formed in the recess;

FIG. 15 is a cross-section side view of the wafer of FIG. 14 rotated with tape applied to the mold compound;

FIG. 16 is a cross-section side view of the wafer of FIG. 15 singulated;

FIGS. 25A-25B illustrate a process for singulating a wafer with a BSP layer applied thereto; and FIGS. 26A-26B illustrate a process for singulating a wafer without a BSP layer applied thereto.

DESCRIPTION

This disclosure, its aspects and implementations, are not limited to the specific components, assembly procedures or method elements disclosed herein. Many additional components, assembly procedures and/or method elements known in the art consistent with the intended semiconductor devices will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor devices, and implementing components and methods, consistent with the intended operation and methods.

Particular implementations of the semiconductor devices and implementing components and methods may be similar to or the same as the semiconductor devices and implementing components and methods disclosed in U.S. Pat. No. 9,905,522 to Yusheng Lin entitled "Semiconductor Copper Metallization Structure and Related Methods," Application Ser. No. 15254640, filed Sep. 1, 2016, issued Feb. 27, 2018, (the '522 Patent), and U.S. Pat. No. 9,640,497 entitled "Semiconductor Backmetal (BM) and Over Pad Metallization (OPM) Structures and Related Methods," to Yusheng Lin, Application Ser. No. 15198859, filed Jun. 30, 2016, and issued on May 2, 2017, (the '497 Patent) the disclosures of each of which are hereby incorporated entirely herein by reference.

Figure 1:
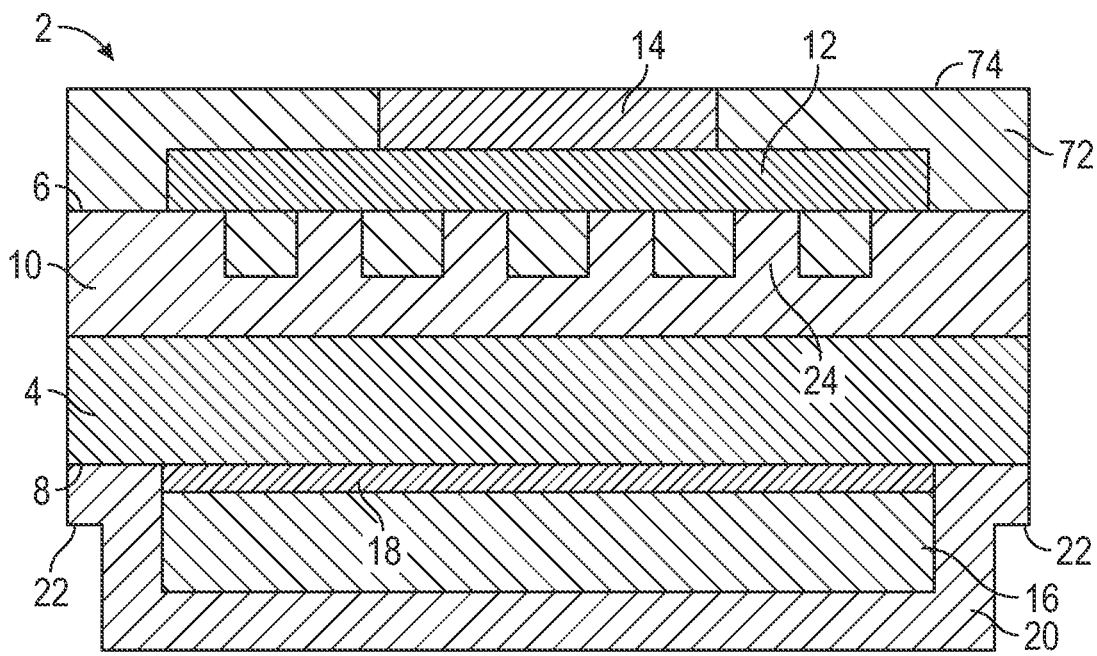
FIG. 1 is a cross-section side view of a first implementation of a semiconductor device.

In various implementations, the semiconductor devices disclosed herein may be power semiconductor devices, such as, by non-limiting example, metal oxide semiconductor field effect transistors (MOSFETs), or insulated-gate bipolar transistors (IGBTs). In other implementations, the devices may be other types of power semiconductor devices or may be semiconductor devices that are not power semiconductor devices. Referring to FIG. 1, a cross-section side view of a first implementation of a semiconductor device is illustrated. The semiconductor device 2 includes a die 4 having a first side 6 and a second side 8. The die 4 may include silicon, and in various implementations, may include an epitaxial portion 10. It is understood that where this disclosure refers to a silicon die, the silicon die could be any type of silicon die including by non-limiting example, an epitaxial silicon die, silicon-on-insulator, polysilicon, any combination thereof, or any other silicon-containing die material. Further, it is also understood that in various implementations a die other than a silicon-containing die may be used, such as, by non-limiting example, gallium arsenide, or a metal-containing die. In the implementation illustrated in FIG. 1, the semiconductor device may be a trench MOSFET device as indicated by the patterned portion 24 in the epitaxial portion 10 of the die 4 showing the positions of the trenches, however, other implementations may not include a trench MOSFET structure but may include a different semiconductor device that may or may not be a power semiconductor device. In various implementations, the die 4 may be about 25 micrometers (μm) thick, about 40 μm thick, about 75 μm thick, more than about 75 μm thick, between about 25 μm and about 75 μm thick, less than about 30 μm thick, and less than about 25 μm thick.

In various implementations, the semiconductor device 2 may include a conductive layer 12 coupled to the first side 6 of the die 4. The conductive layer may be metal or a metal alloy, and in such implementations may include, by non-limiting example, aluminum, copper, gold, silver, titanium, nickel, any other metal, and any combination thereof. In various implementations, the conductive layer 12 may be as long and as wide as the die 4, however, in other implementations, such as is illustrated by FIG. 1, the conductive layer may be less long or less wide than the length or width of the die 4.

In various implementations, the semiconductor device 2 may include a contact pad 14 coupled to the conductive layer. The contact pad 14 may be any type of metal or metal alloy disclosed herein. In particular implementations, the contact pad may be SnAg or NiAu. The contact pad 14 may be as long and as wide as the conductive layer 12, however, in other implementations, such as is illustrated by FIG. 1, the contact pad may be less long or less wide than the length or width of the conductive layer 12. In various implementations, the semiconductor device 2 may not include a contact pad 14 in addition to the conductive layer 12, but may use the conductive layer as the contact pad. Similarly, in particular implementations the semiconductor device 2 may not include a conductive layer 12 but may include the contact pad 14 directly coupled to the first side 6 of the die 4.

In various implementations, an intermediary pad may be coupled between the conductive layer 12 and the contact pad 14. The intermediary pad may be a metal deposited using electroplating, and in particular implementations, may be electroplated copper. In particular implementations, the intermediary pad may include a metal alloy, and may include, by non-limiting example, Ni, Au, Pd, Cu, or any combination thereof. In various implementations, the intermediary pad may have varying widths, with a first portion of the intermediary pad directly coupled to the conductive layer 12 having a smaller width in cross section than a second portion of the intermediary pad directly coupled to the contact pad 14. In other implementations, the first portion of the intermediary pad may have the same width in cross section as a second portion of the intermediary pad.

In various implementations, as illustrated by FIG. 1, the semiconductor device may include a passivation material 72 coupled over the die 4. A surface 74 of the passivation material may be coplanar with a plane formed by an exposed surface of the contact pad 14. In implementations including an intermediary pad, the passivation layer may only cover a portion of the intermediary pad, leaving the entirety of the contact pad 14 not directly coupled to the passivation layer. In particular implementations, the passivation material may at least partially encapsulate the conductive layer 12. The passivation material may be, by non-limiting example, SiN, $SiO_2$, or any other type of passivation material.

Still referring to FIG. 1, the semiconductor device 2 includes a metal layer/backmetal layer 16, coupled to the second side 8 of the die 4. In various implementations the metal layer may include, by non-limiting example, copper, gold, silver, aluminum, titanium, nickel, any other metal, and any combination thereof. In particular implementations, the metal layer 16 may be the same as or similar to the back metal layers disclosed in the '522 Patent and the '497 Patent, both of which were previously incorporated by reference herein. In various implementations, the metal layer 16 may include a single type of metal or metal alloy, while in other implementations the metal layer may include multiple metal layers of the same or differing metals and/or metal alloys. In various implementations, the metal layer 16 may be about 10 μm thick, about 25 μm thick, about 40 μm thick, less than about 10 μm thick, between about 10-40 μm thick, and more than about 40 μm thick, including thicknesses as large as about 200 μm thick. As compared to the die 4, in various implementations the thickness of the die may be no more than about four times the thickness of the metal layer 16. In more particular implementations, the thickness of the die 4 may be about three times the thickness of the metal layer 16, about two and a half times the thickness of the metal layer, about twice the thickness of the metal layer, or about the same thickness as the metal layer 16. In other implementations, a thickness of the die 4 may be more than about four times the thickness of the metal layer 16 or less than the thickness of the metal layer 16.

In various implementations, the semiconductor device 2 may include a seed layer 18 between the second side 8 of the die 4 and the metal layer 16. The seed layer 18 may be configured to facilitate the bond between the metal layer 16 and the die 4 and/or provide a location for electrodeposition to begin during electroplating operations. The seed layer 18 may include metal or a metal alloy, and in particular implementations may include TiCu or TiWCu. In other implementations, the seed layer 18 may include any metal previously disclosed herein.

In various implementations, the semiconductor device 2 may include a mold compound/resin/protective coating (hereinafter referred to as "mold compound" 20) coupled to the metal layer 16. Though the term "mold compound" is used herein to describe the material over the metal layer, it is understood that as used herein, this term includes many types of resins, epoxies, and other kinds of protective coatings. In particular implementations, the mold compound 20 may be directly coupled to the metal layer 16, and in even more particular implementations, the mold compound may be directly coupled over the metal layer. As illustrated by FIG. 1, the mold compound 20 may encapsulate the metal layer 16. In other implementations, as shown and discussed later herein, the metal layer 16 may be exposed through the mold compound 20. The sidewalls 22 of the mold compound 20 may be stepped, however, in other implementations, the sidewalls 22 may not include a step.

The semiconductor device of FIG. 1, along with the other semiconductor devices disclosed herein, may be coupled to or paired with other semiconductor devices, which may be the same type or a differing type of semiconductor device. In various implementations, the semiconductor devices may be paired and/or electrically/thermally coupled together through the metal layer 16. By non-limiting example, the devices may also be paired together using wire bonds, conductive traces, or any other coupling means.

Figure 2:
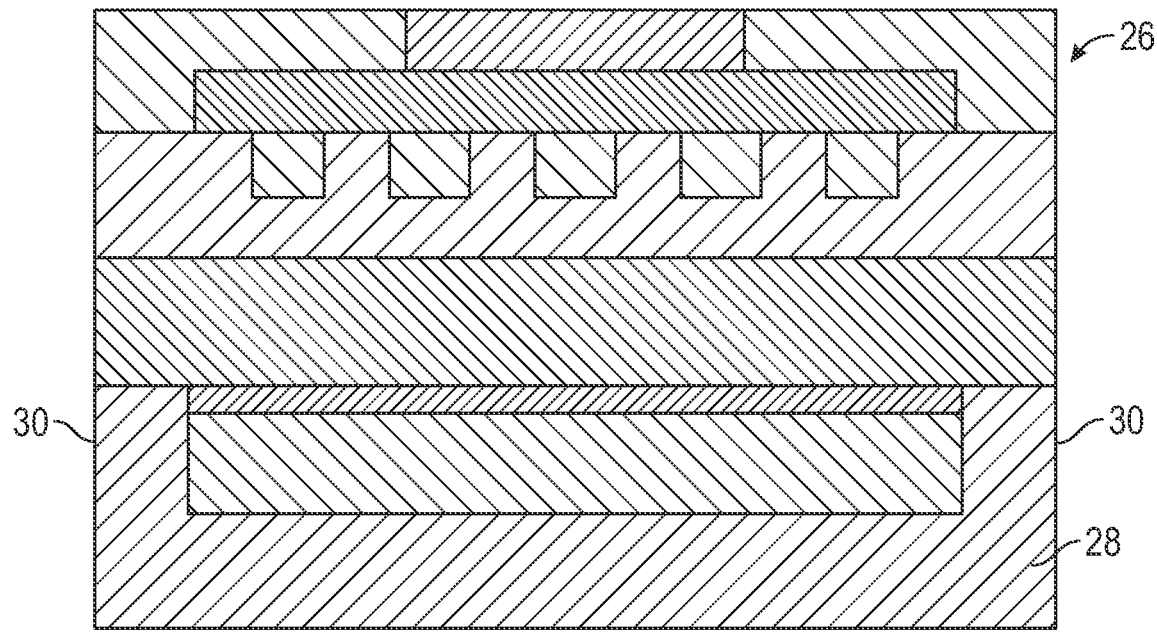
FIG. 2 is a cross-section side view of a second implementation of a semiconductor device.

Referring to FIG. 2, a cross-sectional view of a second implementation of a semiconductor device is illustrated. The semiconductor device 26 is similar to the semiconductor device 2 of FIG. 1, with the exception that the mold compound 28 is thicker than the mold compound 20 of FIG. 1. However, in various implementations, the mold compound may be thinner than thickness of the mold compound illustrated by FIG. 1. Further, in various implementations, the sidewalls 30 of the mold compound 28 are not stepped.

Figure 3:
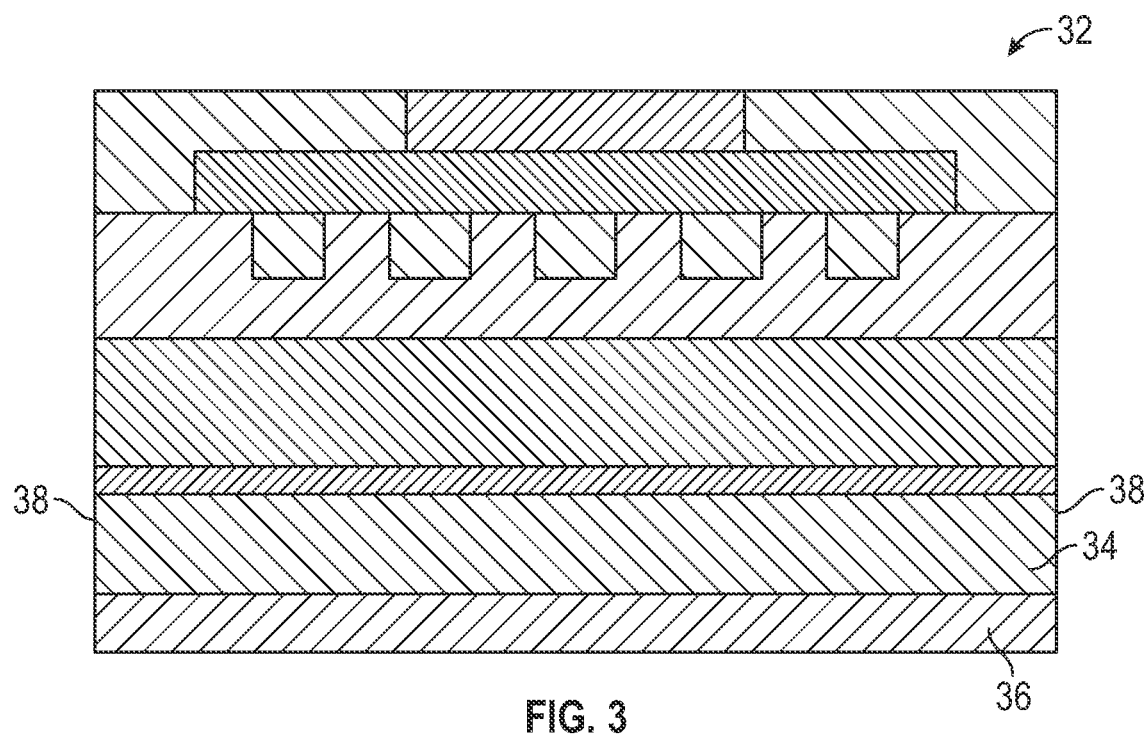
FIG. 3 is a cross-section side view of a third implementation of a semiconductor device.

Referring to FIG. 3, a cross-section side view of a third implementation of a semiconductor device is illustrated. The semiconductor device 32 is similar to the semiconductor device 2 of FIG. 1, with the exception that the metal layer 34 is the same length and width as the length and width of the die 4. By being the same length and width of the die, the metal layer is exposed on the sidewalls of the semiconductor device. The semiconductor device 32 may also include a mold compound 36 coupled to the metal layer 34. As illustrated by FIG. 3, the mold compound may be directly coupled to the metal layer without being directly coupled to any sidewalls 38 of the metal layer 34. In various implementations, the semiconductor device of FIG. 3 may be paired with any number of other semiconductor devices. The other semiconductor devices may be the same as the device illustrated by FIG. 3. In such implementations, the devices may be positioned side-by-side so that the metal layer 16 directly contacts the metal layer of the other semiconductor device, thus allowing the semiconductor devices to be electrically paired through the metal layers on the backside of the semiconductor devices.

In other implementations, the semiconductor device may have a conductive layer coupled over the metal layer 34 in place of the mold compound 36. The conductive layer may be any type of conductive layer disclosed herein. Such an implementation is similar to the implementation illustrated by FIG. 5 herein, with the difference being that the sidewalls of the conductive layer and the metal layer may be coextensive with the sidewalls of the die.

Figure 4:
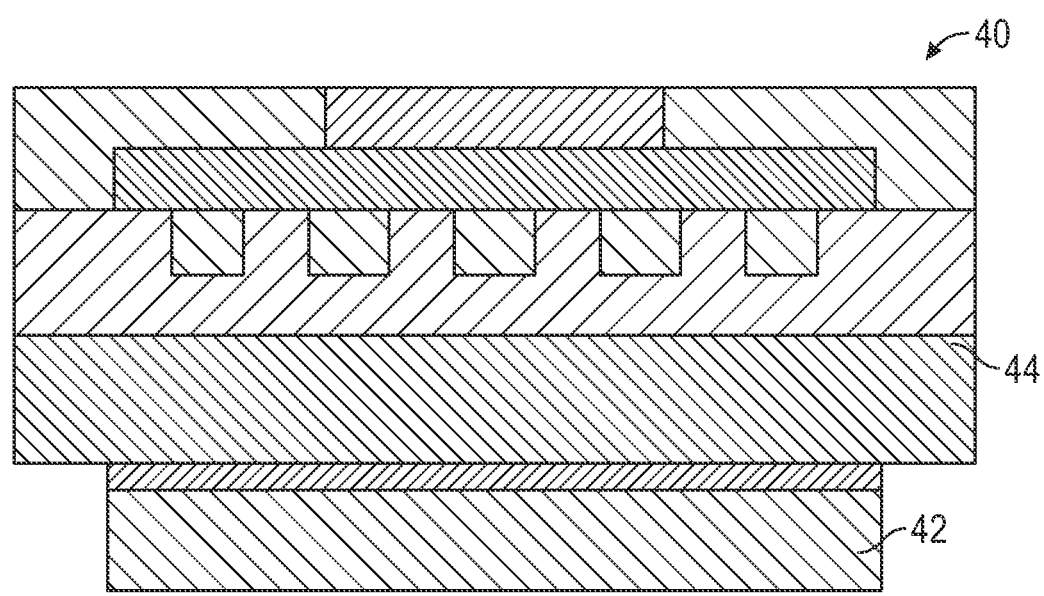
FIG. 4 is a cross-section side view of a fourth implementation of a semiconductor device.

Referring to FIG. 4, a cross-section side view of a fourth implementation of a semiconductor device is illustrated. The semiconductor device 40 may be similar to the semiconductor device of FIG. 1, with the exception that there is no mold compound coupled to the metal layer 42. In such implementations, the perimeter of the metal layer may be coextensive with the sides of the die 44, as is illustrated by the metal layer of FIG. 3, or the perimeter of the metal layer 42 may be set in from the sides of the die, as is illustrated by FIG. 4.

Figure 5:
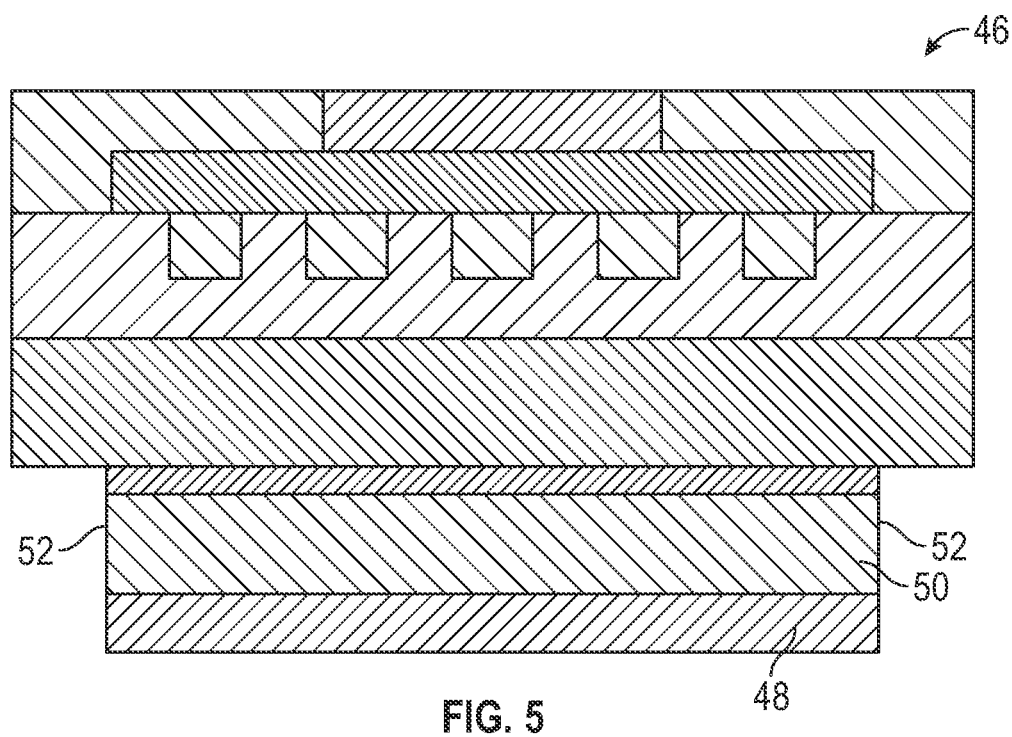
FIG. 5 is a cross-section side view of a fifth implementation of a semiconductor device.

Referring to FIG. 5, a cross-sectional view of a fifth implementation of a semiconductor device is illustrated. The semiconductor device 46 may be similar to the semiconductor device of FIG. 4, with the exception that there is a conductive layer 48 formed over the metal layer 50. The layer may be thermally and/or electrically conductive in various implementations. In various implementations, the conductive layer may be a second metal layer and may include any metal or metal alloy disclosed herein, including, by non-limiting example, Ni, SnAg and NiAu. In particular implementations, the conductive layer 48 may be a bump or pad. The conductive layer, bump, or pad may or may not be coextensive with the sides 52 of the metal layer 50.

Figure 6:
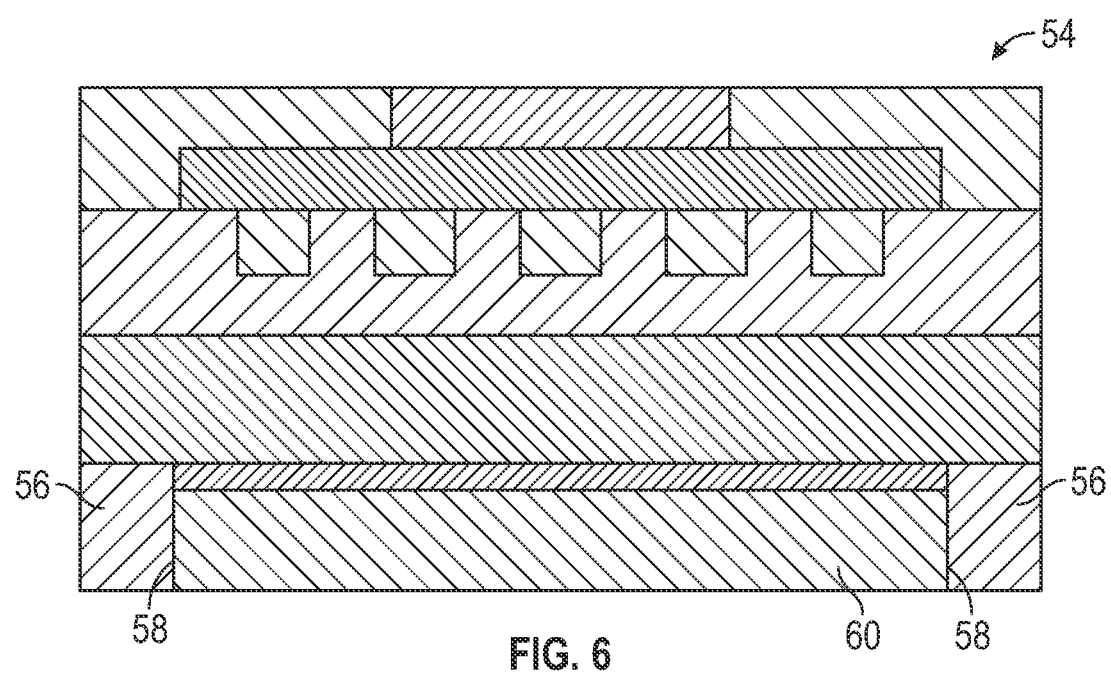
FIG. 6 is a cross-section side view of a sixth implementation of a semiconductor device.

Referring to FIG. 6, a cross-sectional view of a sixth implementation of a semiconductor device is illustrated. The semiconductor device 54 may be similar to the semiconductor device of FIG. 4, with the exception that there is a mold compound 56 directly coupled to the sidewalls 58 of the metal layer 60. Because the mold compound 56 is only coupled to the sidewalls of the metal layer 60, the surface of the metal layer parallel with a plane formed by the largest surface of the die is exposed through the mold layer 56.

Figure 7:
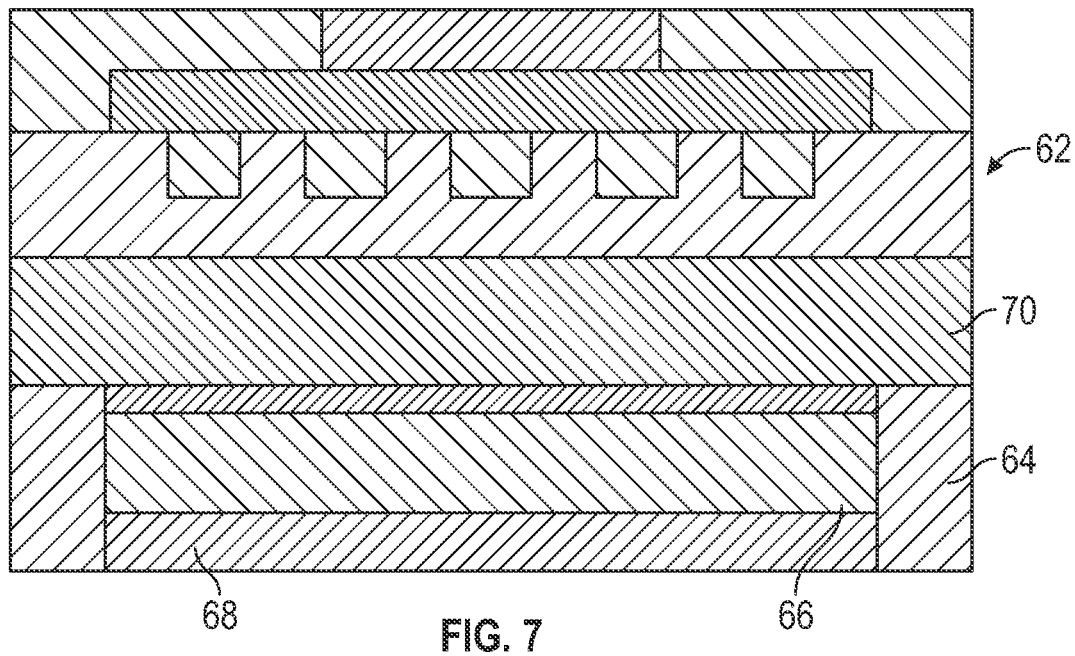
FIG. 7 is a cross-section side view of a seventh implementation of a semiconductor device.

Referring to FIG. 7, a cross-sectional view of a seventh implementation of a semiconductor device is illustrated. The semiconductor device 62 may be similar to the semiconductor device of FIG. 5, with the exception that there is a mold compound 64 directly coupled to the sidewalls of both the metal layer 66 and the conductive layer 68 coupled over the metal layer. In the implementation illustrated by FIG. 7, the mold compound is not over the conductive layer 68, thus the conductive layer may be exposed through the mold compound 64. The conductive layer may be the same as or similar to the conductive layer of FIG. 5.

Throughout this disclosure the term "over" is used with respect to various layers and elements. This term is not meant to convey position, up or down, in the drawings, but is meant to convey a relative outer position. For example, using the up (above) and down (below) directions of FIG. 7, a layer placed above the die 70 would be "over" the die, and a layer placed below the metal layer 66 would similarly be "over" the metal layer.

Figure 8:
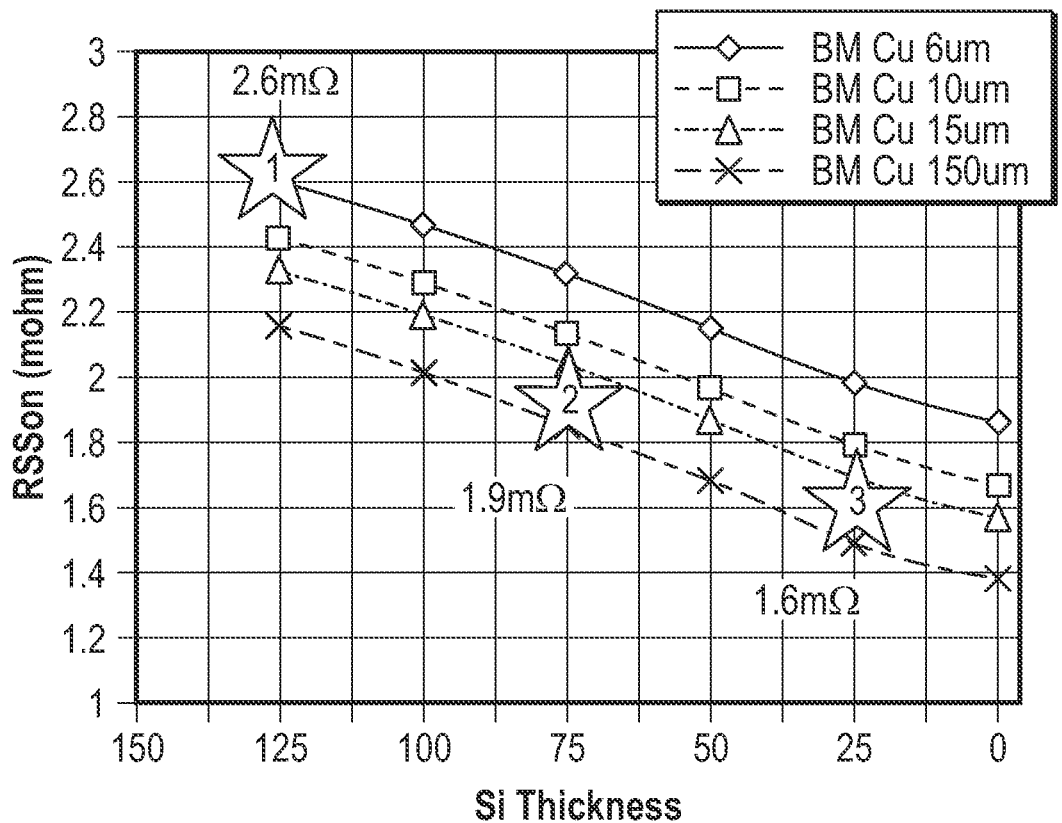
FIG. 8 is a graph showing the ON resistance of various implementations of semiconductor devices.

Referring to FIG. 8, a graph showing the ON resistance of various implementations of semiconductor devices is shown. The Y-axis of the chart illustrates the ON resistance in milliohms (mil). The X-axis of the chart illustrates the thickness of the silicon die in micrometers. The resistance of die with varying thicknesses of backmetal are illustrated by the four lines on the graph. As illustrated by the graph, the ON resistance decreases as the thickness of the silicon layer decreases, and also as the thickness of the backmetal increases. The first star represents a first semiconductor device having a silicon die 125 μm thick and a backmetal layer 6 μm thick. It has an ON resistance of 2.6 mil. The second star represents a second semiconductor device having a silicon die 75 μm thick and a backmetal layer 15 μm thick. The ON resistance for the second semiconductor device is 1.9 mil. The third star represents a third semiconductor device having a silicon die 25 μm thick and a backmetal layer 15 μm thick. The third semiconductor device has an ON resistance of 1.6 mil. As illustrated by the graph, the ON resistance decreases as the thickness of the silicon layer decreases, and also as the thickness of the backmetal increases. This low ON resistance may be beneficial for semiconductor devices used in a variety of applications, including rapid charging systems. Further, by significantly decreasing the thickness of the die, the overall size of the semiconductor package may be decreased.

Figure 9:
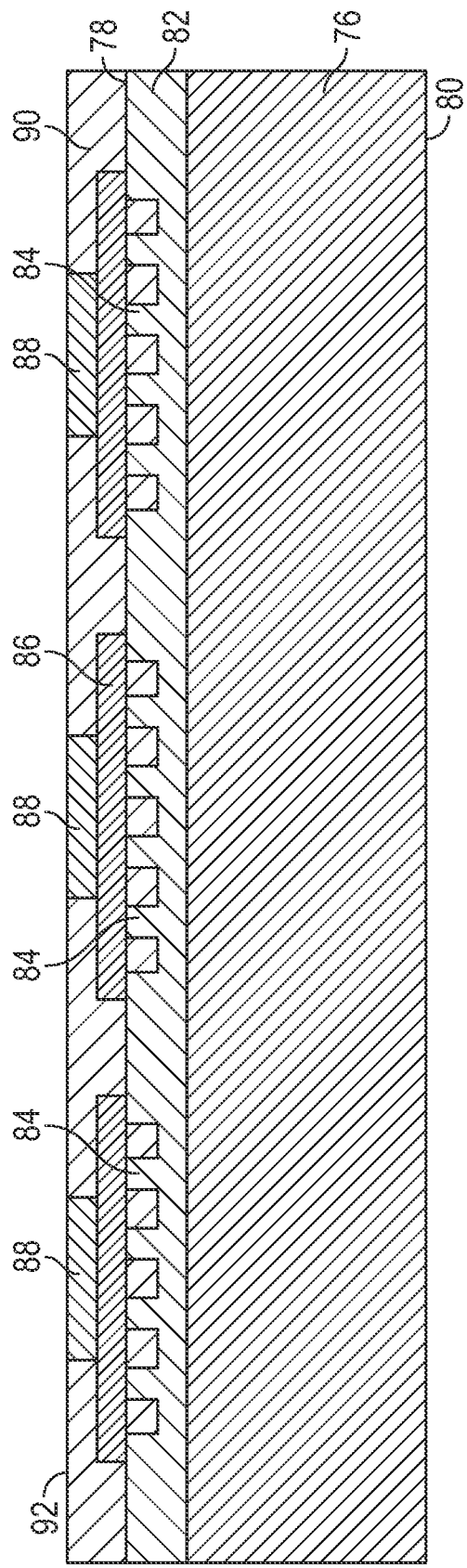
FIG. 9 is a cross-section side view of a wafer.

Referring to FIGS. 9-24, various methods are illustrated for forming the various semiconductor devices illustrated in FIGS. 1-7. Referring specifically to FIG. 9, a cross-sectional view of a wafer is illustrated. In various implementations, the method of forming a semiconductor device includes providing a wafer 76 having a first side 78 and a second side 80. In various implementations, the wafer 76 may be silicon. It is understood that where this disclosure refers to a silicon layer, the silicon layer could be any type of silicon layer including by non-limiting example, an epitaxial silicon layer, silicon on insulator, polysilicon, any combination thereof, or any other silicon-containing substrate material. As illustrated by FIG. 9, the wafer 76 may include an epitaxial silicon portion 82. Further, it is also understood that in various implementations a substrate other than a silicon-containing substrate may be used, such as, by non-limiting example, gallium arsenide, or a metal-containing substrate. In various implementations, the method may include partially/fully forming a plurality of semiconductor devices within the wafer 76. In particular implementations, a plurality of power semiconductor devices may be partially/fully formed within the epitaxial silicon portion 82, including, by non-limiting example, MOSFETs, IGBTs, or any other power semiconductor device. In the implementation illustrated by FIG. 9, a plurality of trenched MOSFETs 84 are partially formed within the epitaxial silicon portion 82. The portions of the power semiconductor devices formed within the wafer 76 may include wiring/routing to allow the semiconductor devices to be connected to other package components and/or a circuit when in use. In such implementations, the wiring may be aluminum or any other electrically conductive material disclosed herein.

In various implementations, a method for forming a semiconductor device may include forming a conductive layer 86 over the first side 78 of the wafer 76. In various implementations, and as illustrated by FIG. 9, the conductive layer may be patterned, however in other implementations, the conductive layer may not be patterned. The conductive layer may be metal or a metal alloy, and in such implementations may include, by non-limiting example, aluminum, copper, gold, silver, titanium, nickel, any other metal, and any combination thereof including those disclosed herein.

In various implementations, the method for forming a semiconductor device may include forming a plurality of contact pads 88 coupled to the first side 78 of the wafer 76. As illustrated by FIG. 9, the conductive layer 86 may separate the contact pads 88 from the wafer 76. In other implementations, the method may include forming the contact pads directly to the wafer and omitting the conductive layer from the process of forming the semiconductor device. In various implementations, the plurality of contact pads 88 may form a solder top metal (STM) and may be made from any metal or metal alloy. In particular implementations, the plurality of contact pads may be NiAu. In such implementations, the NiAu contact pads may be formed through electroless plating onto the conductive layer 86 or the wafer 76. The plurality of contact pads 88 may be considered as on the source side of the wafer 76.

Still referring to FIG. 9, the method of forming the semiconductor device may include applying a passivation layer 90 to the wafer 76, conductive layer 86, and/or the plurality of contact pads 88. The passivation layer 90 may be any type of passivation layer previously disclosed herein. The passivation layer 90 may at least partially encapsulate the conductive layer 86. Further, the plurality of contact pads 88 may be exposed through the passivation layer 90. In particular implementations, the passivation layer 90 may initially cover the plurality of contact pads 88 and the plurality of contact pads 88 may be exposed through the passivation layer by backgrinding or chemical-mechanical-polishing (CMP) the passivation layer. Further, as illustrated by FIG. 9, a surface 92 of the passivation layer 90 may be coplanar with a plane formed by the exposed portions of the plurality of contact pads 88. The passivation 90 layer and the plurality of contact pads 88 may be planarized using, by non-limiting example, CMP techniques.

In other implementations, the method for forming the semiconductor package may include forming an intermediary layer between the conductive layer 86 and the contact pads 88. The intermediary layer may be an electroplated metal layer, and in particular implementations may be electroplated copper. The intermediary layer may include an alloy including, by non-limiting example, Ni, Au, Pd, Cu, and any combination thereof. In other implementations, the intermediary layer may be sputtered onto the conductive layer 86. In various implementations, the method of forming the intermediary layer may include forming a plurality of layers within the intermediary layer. In such implementations, one of the plurality of layers may be a seed layer which may include Ti or Cu. In particular implementations, the method of forming a semiconductor package may include patterning the intermediary layer into a plurality of intermediary pads. Where the method of forming the intermediary layer includes forming a plurality of layers within the intermediary layer, each layer within the intermediary layer may have varying patterns that form intermediary pads with stepped sidewalls. During the process of forming the intermediary layers, the seed layer may be etched following the forming of the material that forms the pads 88. As an example, the intermediary layer may be patterned to form the plurality of intermediary pads having a first portion directly coupled to the conductive layer with a smaller width in cross section than a second portion of the plurality of intermediary pads directly coupled to the contact pads 88. In implementations where the intermediary pads are formed, the passivation layer may completely or partially cover the sidewalls of the intermediary pads.

Figure 10:
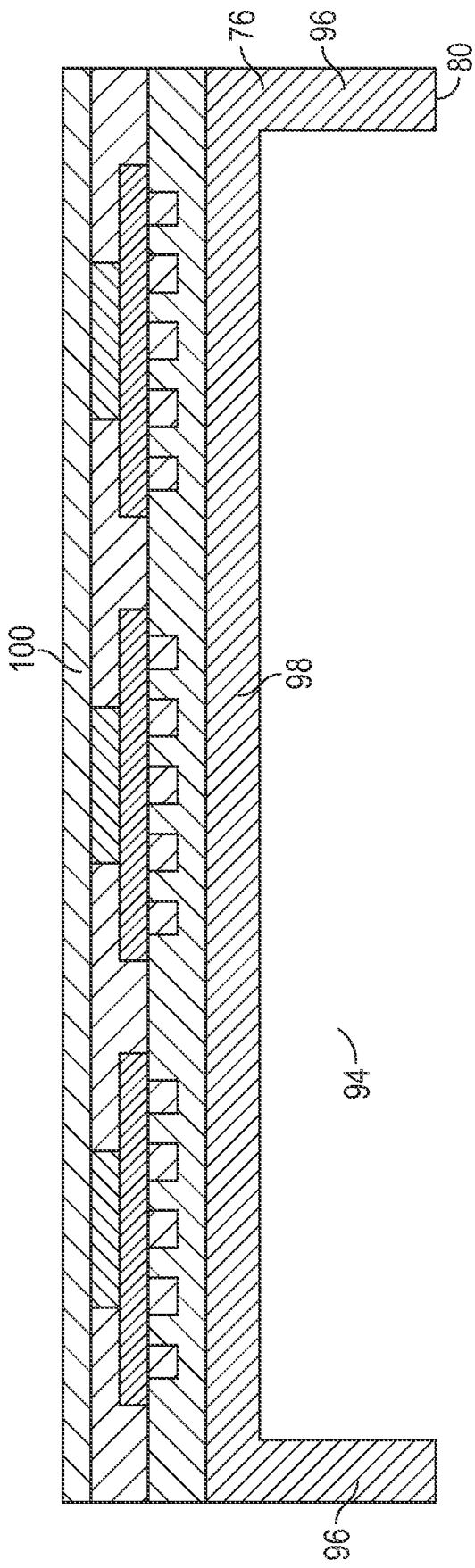
FIG. 10 is a cross-section side view of the wafer of FIG. 9 with a recess formed therein.

Referring to FIG. 10, a cross-section side view of the wafer of FIG. 9 with a recess formed therein is illustrated. In various implementations, the method of forming a semiconductor device includes forming a recess 94 in the second side 80 of the wafer 76. Through forming the recess 94, the wafer 76 may be thinned. In various implementations, the recess 94 may be formed through backgrinding the second side 80 of the wafer 76. In such implementations, a backgrind tape 100 may be coupled to the contact pads. In particular implementations, the recess 94 may be formed through backgrinding using a process marketed under the trade name TAIKO by DISCO of Tokyo, Japan. The backgrinding leaves a ring 96 of non-removed material (TAIKO ring) which helps to prevent the wafer from curling, warping or otherwise bending during processing while at the same time removing most of the thickness and material of the second side 80, or backside of the wafer 76. In other implementations of methods of forming semiconductor devices the TAIKO process may not be used, but some other backgrinding or other material-removal technique may be used, such as removing the material through a wet etch. In various implementations, the thinned portion 98 of the wafer 76 may be thinned to about 25 µm thick, about 40 µm thick, about 75 µm thick, more than about 75 µm thick, between about 25 µm and about 75 µm thick, less than about 30 µm thick, and less than about 25 µm thick.

Referring to FIG. 11, a cross-section side view of the wafer of FIG. 10 with a mask formed in the recess is illustrated. The mask may be formed using various processes, including, by non-limiting example, photolithographic, film attach, and other methods of forming a pattern in the recess. The method may also include forming a patterned photoresist layer 104 within the recess 94. In various implementations, the method of forming the semiconductor device also includes coating the recess 94 with a seed layer 102 either before or after forming the mask. The seed layer 102 may be any metal or metal alloy. In particular implementations, the seed layer may be TiCu or TiWCu. In various implementations, the interior of the recess may be coated with the seed layer 102 through sputtering. Referring to FIG. 12, a cross-section side view of the wafer of FIG. 10 with a metal layer formed in the recess is illustrated. In various implementations, the method of forming the semiconductor device may include forming a metal layer 106, or a backmetal, within the recess 94. The metal layer 106 may include copper, aluminum, gold, silver, nickel, titanium, any other metal, and any combination thereof. In implementations with the seed layer 102 coupled to the wafer 76 within the recess 94, the metal layer 106 may be coupled to the wafer 76 through the seed layer 102. The metal layer may be applied through a copper plating, or other metallic plating process in some implementations. In other implementations, the metal layer may be applied using a sputtering or evaporation process.

In various implementations, the metal layer 106 may include multiple layers of the same or different metals, while in other implementations, the metal layer may only include a single layer of metal. In various implementations, the metal layer 106 may be about 10 µm thick, about 25 µm thick, about 40 µm thick, less than about 10 µm thick, between about 10-40 µm thick, and more than about 40 µm thick, including thickness as great as about 200 µm thick. As compared to the thinned portion 98 of the wafer 76, in various implementations the thickness of the thinned portion of the wafer is no more than about four times the thickness of the metal layer 106. In more particular implementations, the thickness of the thinned portion 98 of the wafer 76 may be substantially three times the thickness of the metal layer 106, two and a half times the thickness of the metal layer, twice the thickness of the metal layer, or about the same thickness as the metal layer 106. In other implementations, a thickness of the thinned portion 98 of the wafer 76 may be more than about four times the thickness of the metal layer 106 or less than the thickness of the metal layer 106.

In particular implementations, and as illustrated by FIG. 12, the method may include patterning, or forming openings 108 within, the metal layer 106. The photoresist layer 104 of FIG. 11 may be used to form the openings 108, or the patterns of the metal layer 106. The photoresist layer 104 and portions of the seed layer 102 may be stripped away after the metal layer 106 is formed within the recess 94. In various implementations, the metal layer 106 may not include a dicing street which may reduce chipping of the wafer 76 (and consequently the singulated die) when it comes time to singulate the wafer.

Figure 13:
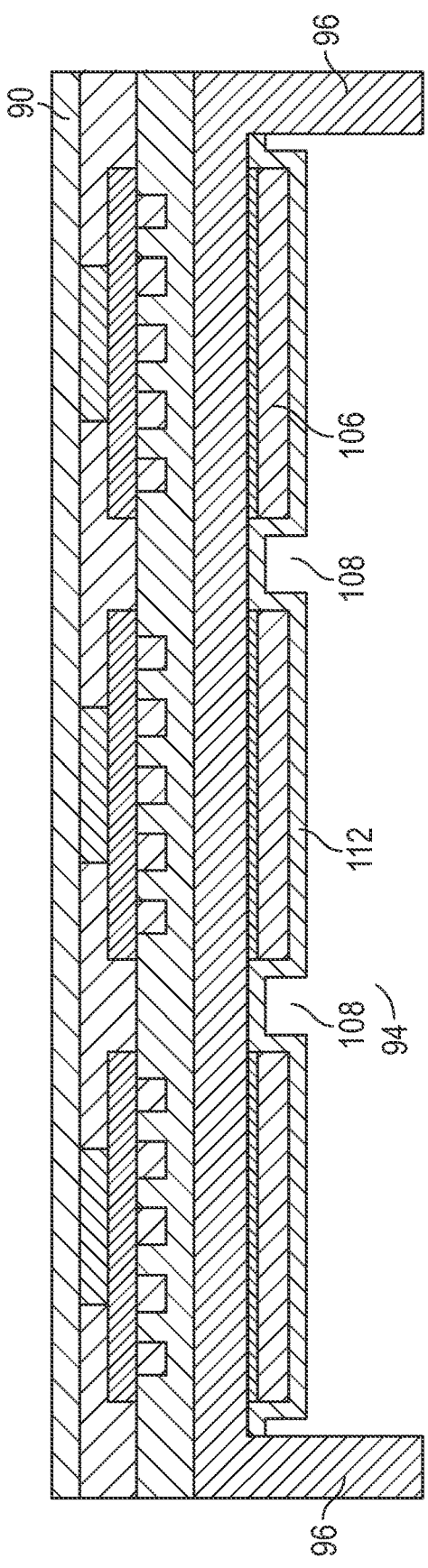
FIG. 13 is a cross-section side view of the wafer of FIG. 12 with a mold compound formed over the metal layer.

Referring to FIG. 13, a cross-sectional view of the wafer of FIG. 12 with a mold compound formed over the metal layer is illustrated. The method of forming the semiconductor device may include coupling a mold compound 112 with the metal layer 106 within the recess 94. The mold compound 112 may be applied to prevent oxidation of the metal layer 106 as well as to protect the metal layer from physical damage. In various implementations, the mold compound 112 may be directly coupled over the metal layer 106, as is illustrated by FIG. 13. In implementations where the metal layer 106 is patterned, the mold compound 112 may also be within the openings 108 within the metal layer 106. In various implementations, the mold compound 112 may have a substantially constant thickness, thus the openings 108 are not completely filled with the mold compound 112. The mold compound 112 may be applied to the metal layer 106 using, by non-limiting example, a liquid dispensing technique, a transfer molding technique, a printer molding technique, a compression molding technique, or a laminating technique. In various implementations, the mold compound 112 may be, by non-limiting example, an epoxy mold compound, an acrylic mold compound, or any other type of mold compound or protective covering.

Figure 14:
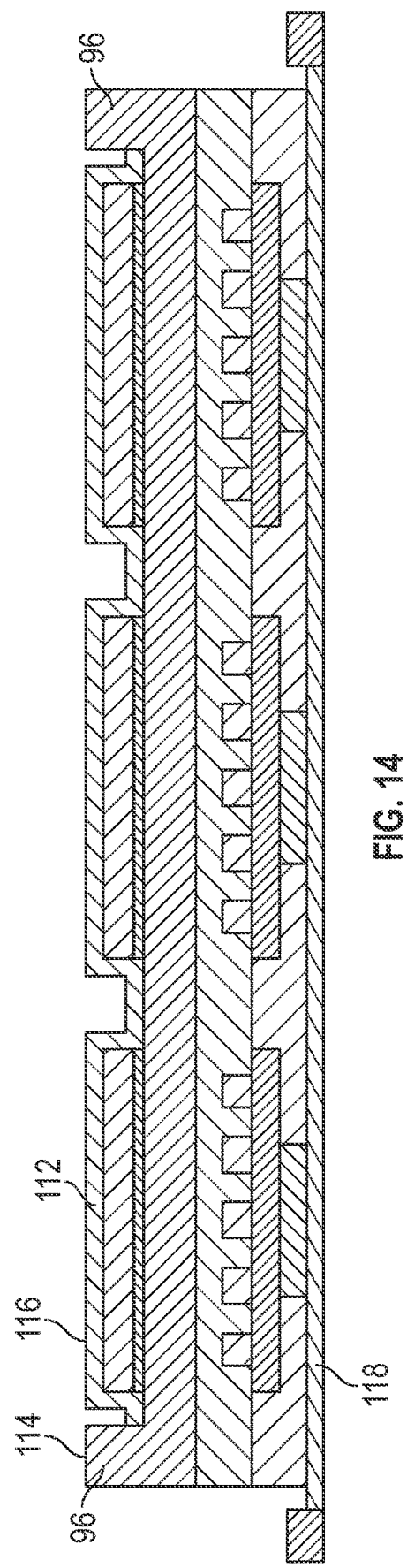
FIG. 14 is a cross-section side view of the wafer of FIG. 13 with a portion of the ring of the wafer removed.

Referring to FIG. 14, a cross-section side view of the wafer of FIG. 13 with a portion of the ring of the wafer removed is illustrated. In various implementations, the method for forming a semiconductor device may include removing a portion of the ring 96. In particular implementations, the portion of the ring 96 may be removed through backgrinding the ring 96. In other implementations, the ring may be at least partially removed using other removal techniques or methods such as circularly sawing off the ring around the edge of the wafer. In various implementations, enough of the ring 96 is removed so that a surface 114 of the ring 96, or wafer 76, is coplanar with a surface 116 of the mold compound 112. In other implementations, the ring portion may be partially removed, but not to the degree that would planarize the surface 114 of the ring 96 with the surface 116 of the mold compound 112. In various implementations, the method may include removing the backgrinding tape 90 from the source side of the wafer 76 and applying a new backgrind/singulation tape 118 to the contact pads as is illustrated by FIG. 14.

Referring to FIG. 15, a cross-section side view of the wafer of FIG. 14 rotated with tape applied to the mold compound is illustrated. The method for forming a semiconductor device may include applying tape to the backside of the wafer 76, or to the mold compound 112. In various implementations, and as illustrated by FIG. 15, the wafer 76 may be removed from backgrind/singulation tape 118 as illustrated in FIG. 14, and the wafer may be rotated with the backside of the wafer and/or mold compound 112, reapplied to the backgrind tape (or initially applied to sawing tape for singulation) 118, as is illustrated in FIG. 15.

Referring to FIG. 16, a cross-section side view of the wafer of FIG. 15 singulated is illustrated. The method for forming the semiconductor device includes singulating the wafer 76 into a plurality of semiconductor devices 120. The wafer 76 may be singulated through, by non-limiting example, blade dicing, laser dicing, water jet cutting, etching, or any other singulation method. As illustrated by FIG. 16, each of the semiconductor devices 120 is the same as semiconductor device 2 illustrated in FIG. 1.

Figure 17:
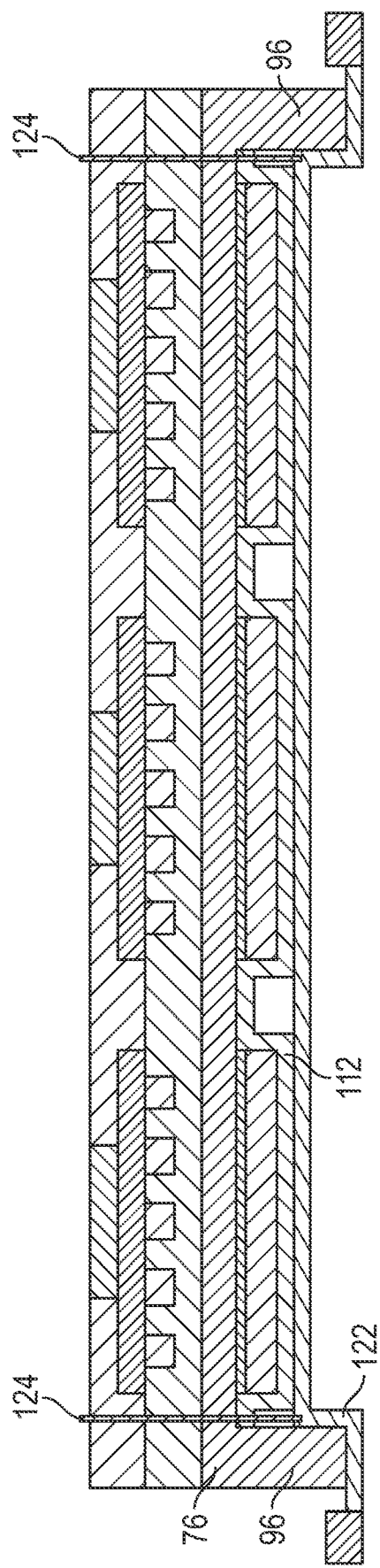
FIG. 17 is a cross-section side view of the wafer of FIG. 13 with tape applied to the mold compound.
Figure 18:
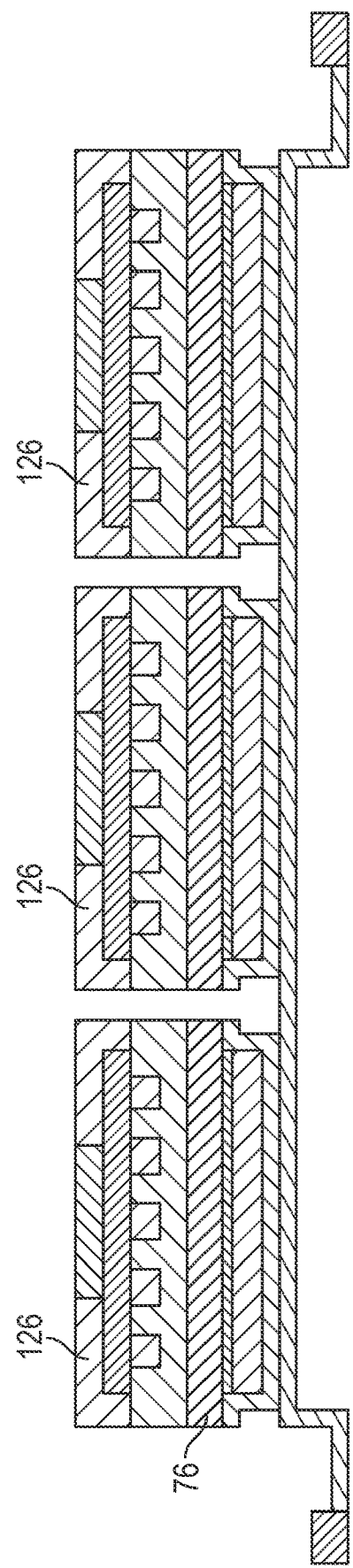
FIG. 18 is a cross-section side view of the wafer of FIG. 17 singulated.

Referring to FIGS. 17-18, an alternative method of forming the semiconductor device of FIG. 1 is illustrated. Referring specifically to FIG. 17, a cross-section side view of the wafer of FIG. 13 with tape applied to the mold compound is illustrated. Rather than backgrind the ring 96 as illustrated by FIG. 14, FIG. 17 illustrates that the method may include applying a tape 122 to the mold compound 112 and to the ring 96 of the wafer 76. The ring 96 may then be removed from the metal layer by cutting through the passivation layer 90, the wafer 76, and the mold compound 112 as indicated by cuts 124. Referring to FIG. 18, a cross-section side view of the wafer of FIG. 17 following singulation is illustrated.

The method may include singulating the wafer 76 into a plurality of semiconductor devices 126. The wafer may be singulated using any singulation method disclosed herein. The plurality of semiconductor devices 126 illustrated by FIG. 18 may be the same as semiconductor device 2 illustrated by FIG. 1.

Figure 19:
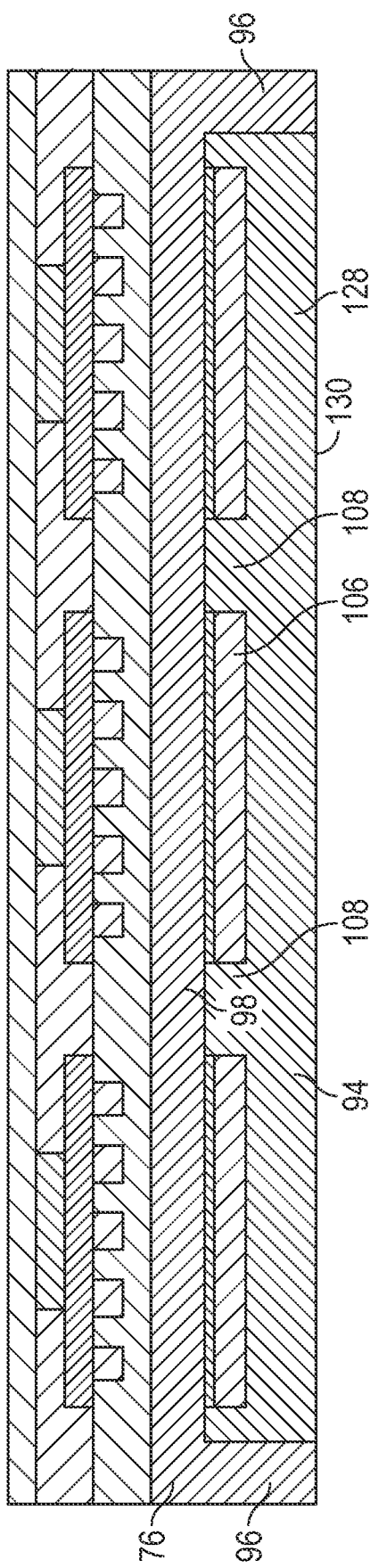
FIG. 19 is a cross-section side view of the wafer of FIG. 12 with a mold compound filling the recess.

Referring to FIG. 19, a cross-section side view of the wafer of FIG. 12 with a mold compound filling the recess is illustrated. FIG. 19 illustrates an alternative method for forming a semiconductor device. Rather than forming a mold compound 112 that has a consistent thickness throughout the length of the protective coating covering the metal layer 106, as illustrated by FIG. 13, the method illustrated by FIG. 19 may include completely filling the recess 94 with a mold compound 128. The mold compound 128 may be applied to the recess using any technique disclosed herein, and may be any type of mold compound or other protective coating disclosed herein. As illustrated by FIG. 19, contrary to FIG. 13, the outer surface 130 of the mold compound 128 has an even surface that does not follow the contours of the patterned metal layer 106, thus the mold compound 128 may have varying thicknesses. In other words, the mold compound 128 may completely fill the openings 108 within the metal layer 106. The mold compound 128 may increase chip strength and may be especially useful in implementations where the thinned portion 98 of the wafer 76 is less than about 30 μm thick.

In other implementations, rather than having the mold compound 128 completely fill the recess 94, the mold compound may only partially fill the recess. In such implementations, the outer surface 130 of the mold compound 128 may still have an even surface that does not follow the contours of the patterned metal layer 106, however, the outer surface 130 may not be coplanar with end of the ring 96.

Still referring to FIG. 19, In various implementations, the method for forming a semiconductor device may include backgrinding the ring 96, the mold compound 128, or both the ring and the mold compound. The wafer 76 may then be singulated into a plurality of semiconductor devices using any singulation method previously disclosed herein. The plurality of singulated semiconductor devices may be the same as the semiconductor device 26 illustrated in FIG. 2. Because the mold compound 128 completely fills the openings 108 within the metal layer 106, the singulated semiconductor devices may have a mold compound 28 with sidewalls 30 that are not stepped, as illustrated in FIG. 2.

Figure 20:
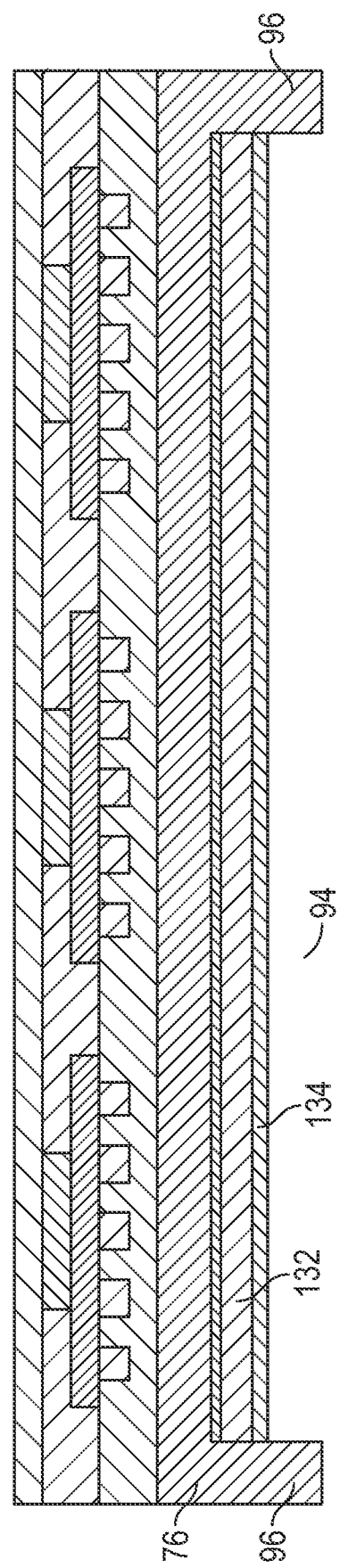
FIG. 20 is a cross-section side view of the wafer of FIG. 10 with a non-patterned metal layer formed within the recess.

Referring to FIG. 20, a cross-section side view of the wafer of FIG. 10 with a non-patterned metal layer formed within the recess is illustrated. FIG. 20 illustrates an alternative method for forming a semiconductor device. Rather than forming a patterned metal layer 106 as illustrated by FIGS. 11-12, the method may include forming a solid metal layer 132 coupled to the wafer 76. In various implementations, the seed layer 102 may be between the metal layer 132 and the wafer 76. The method may include coating the metal layer 132 with a protective coating which may be a mold compound 134. The mold compound 134 may partially fill the recess 94, while in other implementations it may fully fill the recess 94. In various implementations, the method for forming a semiconductor device may include backgrinding the ring 96, the mold compound 134, or both the ring and the mold compound. The wafer 76 may then be singulated into a plurality of semiconductor devices using any singulation method previously disclosed herein. The plurality of singulated semiconductor devices may be the same as the semiconductor device 32 illustrated in FIG. 3. By not patterning the metal layer 132, this method could potentially save costs as compared to the method illustrated by FIGS. 11-12.

In other implementations, the method for forming a semiconductor device may include, rather than coating the metal layer 132 with a mold compound 134, forming a conductive layer to the metal layer 132. The conductive layer may be any type of conductive layer disclosed herein, including Ni, NiAu, SnAg. In various implementations the method may include plating the conductive layer onto the metal layer, while in other implementations the conductive layer is applied to the metal layer through sputtering, evaporation, or other deposition techniques. The method for forming a semiconductor device may include backgrinding the ring 96. The wafer 76 may then be singulated into a plurality of semiconductor devices using any singulation method previously disclosed herein. The plurality of singulated semiconductor devices may be the similar to the semiconductor device 32 illustrated in FIG. 3, with the difference being that in place of the mold compound over the metal layer, the semiconductor device has a conductive layer over the metal layer.

Figure 21:
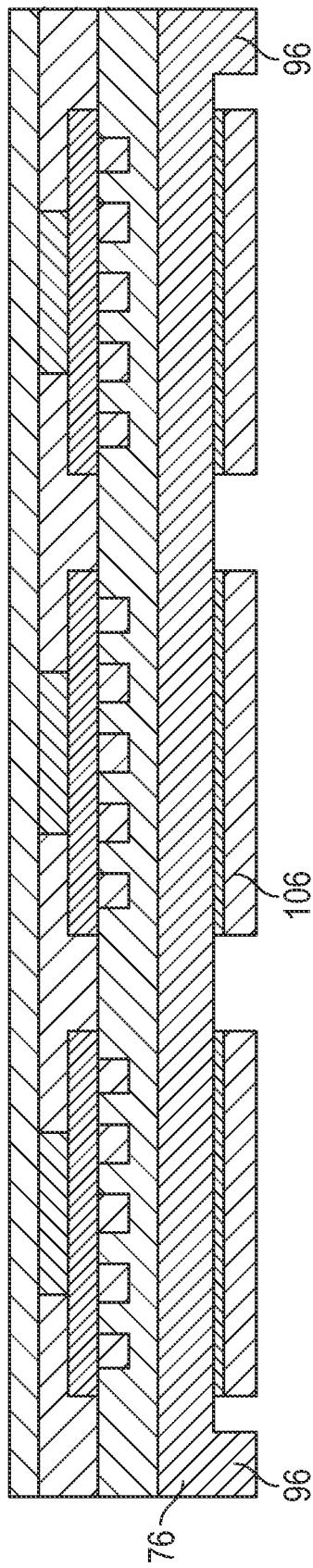
FIG. 21 is a cross-section side view of the wafer of FIG. 12 with a portion of the ring of the wafer removed.

Referring to FIG. 21, a cross-section side view of the wafer of FIG. 12 with a portion of the ring of the wafer removed is illustrated. FIG. 21 illustrates an alternative method for forming a semiconductor device. Rather than forming a mold compound over the metal layer 106 as illustrated by FIGS. 13 and 19, the method may include not covering the metal layer 106 with any kind of mold compound or protective covering. In various implementations, the method for forming a semiconductor device may include backgrinding the ring 96. The wafer 76 may then be singulated into a plurality of semiconductor devices using any singulation method previously disclosed herein. The plurality of singulated semiconductor devices may be the same as the semiconductor device 40 illustrated in FIG. 4.

Figure 22:
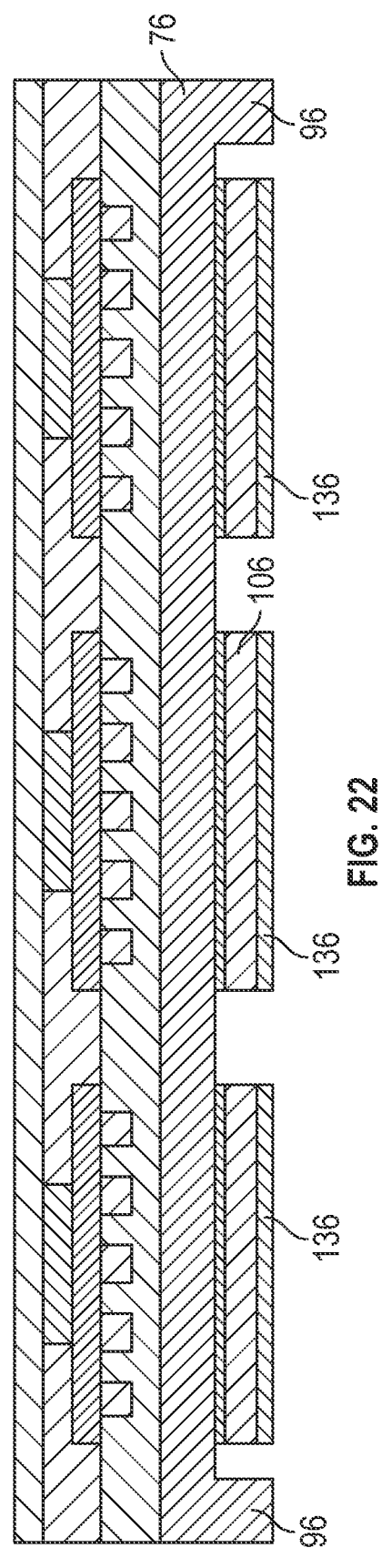
FIG. 22 is a cross-section side view of the wafer of FIG. 21 with a bump formed over the metal layer.

Referring to FIG. 22, a cross-section side view of the wafer of FIG. 21 with a bump formed over the metal layer is illustrated. FIG. 22 illustrates an alternative method for forming a semiconductor device. Rather than leaving the metal layer 106 uncovered as illustrated by FIG. 21, the method may include forming a plurality of bumps/pads 136 over the metal layer 106. In various implementations, the plurality of bumps 136 may be considered a second metal layer over the metal layer 106. The plurality of bumps 136 may be any type of material disclosed herein. In various implementations, the method for forming a semiconductor device may include backgrinding the ring 96. The wafer 76 may then be singulated into a plurality of semiconductor devices using any singulation method previously disclosed herein. The plurality of singulated semiconductor devices may be the same as semiconductor device 46 illustrated in FIG. 5.

Figure 23:
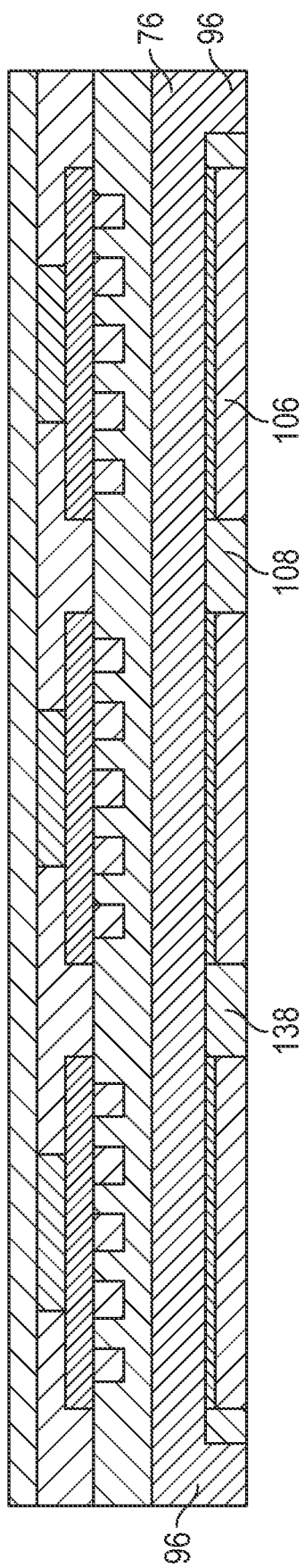
FIG. 23 is a cross-section side view of the wafer of FIG. 21 with a mold compound formed between openings in the metal layer.

Referring to FIG. 23, a cross-section side view of the wafer of FIG. 21 with a mold compound formed between openings in the metal layer is illustrated. FIG. 23 illustrates an alternative method for forming a semiconductor device. Contrary to what is illustrated in FIG. 21, the method illustrated by FIG. 23 includes coupling a mold compound 138 within the openings 108 of the metal layer 106, while leaving the metal layer exposed through the mold compound 138. The outer surface of the mold compound 138 may be coplanar or substantially coplanar with the outer surface of the metal layer 106. In various implementations, the mold compound 138 may initially cover the metal layer 106, as is illustrated by FIG. 19, but may then be background to expose the metal layer 106 through the mold compound 138. In various implementations, the method for forming a semiconductor device may include backgrinding the ring 96, the mold compound 138, or both the ring and the mold compound. The wafer 76 may then be singulated into a plurality of semiconductor devices using any singulation method previously disclosed herein. The plurality of singulated semiconductor devices may be the same as semiconductor device 54 illustrated in FIG. 6.

Figure 24:
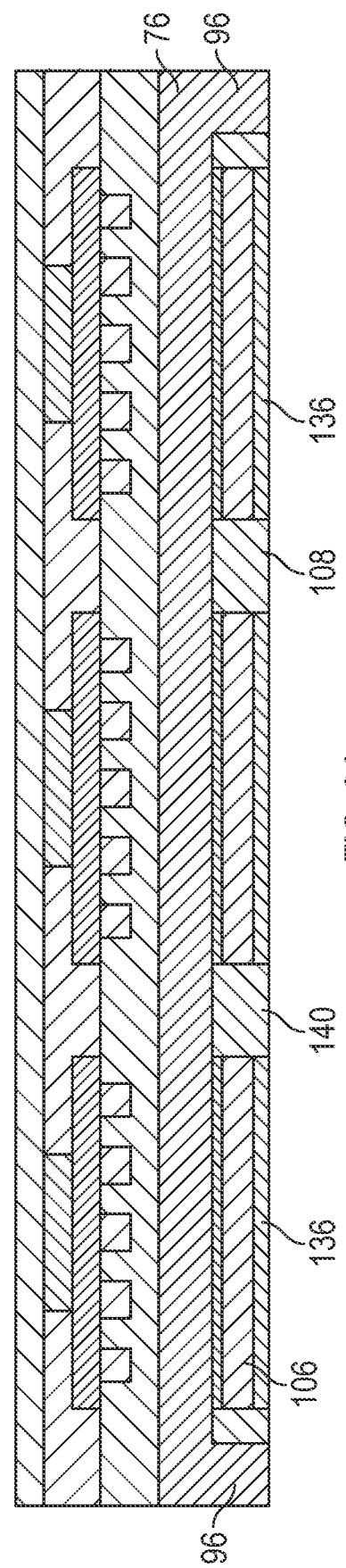
FIG. 24 is a cross-section side view of the wafer of FIG. 22 with a mold compound formed between openings in the metal layer.

Referring to FIG. 24, a cross-section side view of the wafer of FIG. 22 with a mold compound formed between openings in the metal layer is illustrated. FIG. 24 illustrates an alternative method for forming a semiconductor device. Contrary to what is illustrated in FIG. 22, the method illustrated by FIG. 24 includes coupling a mold compound 140 within the openings 108 of the metal layer 106, while leaving the plurality of bumps 136, or the second metal layer exposed through the mold compound 140. The outer surface of the mold compound 140 may be coplanar with the outer surface of the plurality of bumps 136. In various implementations, the mold compound 140 may initially cover the plurality of bumps 136, but may then be background to expose the plurality of bumps through the mold compound 140. In various implementations, the method for forming a semiconductor device may include backgrinding the ring 96, the mold compound 140, or both the ring and the mold compound. The wafer 76 may then be singulated into a plurality of semiconductor devices using any singulation method previously disclosed herein. The plurality of singulated semiconductor devices may be the same as semiconductor device 62 illustrated in FIG. 7.

Referring to FIGS. 25A-25B, a process for singulating a wafer with a backside protection (BSP) layer applied thereto is illustrated. The method illustrated by FIGS. 25A-25B may be incorporated into any method implementation previously disclosed herein. As illustrated by FIG. 25A, a wafer 142 may be coupled to a metal layer 144. In various implementations, the metal layer may be coupled to a BSP layer 146. In various implementations, the BSP layer may be a tape including an epoxy resin and may include a glass filler. In particular implementations the BSP layer may be a wafer backside coating tape marketed under the tradename of ADWILL® by LINTEC Corporation of Tokyo, Japan. The BSP layer may be coupled to a tape 148 used to hold the wafer during singulation of the wafer.

FIG. 25B illustrates the wafer 142, metal layer 144, and BSP layer 146 after they have been singulated to form a semiconductor device 150. As illustrated by FIG. 25B, the sidewall 152 where the wafer, metal layer, and BSP were singulated form a clean cut, meaning the varying layers do not extend into adjacent layers, including the tape 148. Contrary to this, and referring to FIGS. 26A-26B, a process for singulating a wafer without a BSP layer applied thereto is illustrated. FIG. 26A illustrates a wafer 154 coupled to a metal layer 156 coupled directly to the tape 158 used to hold the wafer during singulation. As illustrated by FIG. 26B which depicts the wafer and metal layer of FIG. 26A singulated into a semiconductor device 160, a burr of material 162 resulting from dicing the metal layer 156 may extend into the tape 158. In various implementations, singulating the metal layer that is directly coupled to non-BSP tape may result in burrs similar to burr 162 which may hinder removal of the semiconductor device 160 from the tape 158 during the die picking operations.

In places where the description above refers to particular implementations of semiconductor devices and implementing components, sub-components, methods and sub-methods, it should be readily apparent that a number of modifications may be made without departing from the spirit thereof and that these implementations, implementing components, sub-components, methods and sub-methods may be applied to other semiconductor devices.

What is claimed is:

1. A semiconductor device comprising:
    a die comprising a first side and a second side;
    a contact pad coupled to the first side of the die;
    a metal layer coupled to the second side of the die; and
    a mold compound coupled directly to the metal layer;
    wherein an outer sidewall of the mold compound comprises a step facing away from the metal layer;
    wherein a thickness of the die is less than 30 micrometers;
    wherein the contact pad is exposed through a passivation layer coupled over the die;
    wherein the die is a singulated die;
    wherein the mold compound covers and contacts an outermost sidewall of the metal layer;
    wherein an outer sidewall of the die is coplanar with an outermost sidewall of the mold compound; and
    wherein a perimeter of an entirety of the metal layer is less than and lies within a perimeter of the die.

2. The device of claim 1, wherein the thickness of the die is substantially the same as the thickness of the metal layer.

3. The device of claim 1, wherein five sides of the metal layer are covered by the mold compound and wherein an entire surface of the metal layer opposite a surface facing the die lies in the same plane.

4. The device of claim 1, wherein the mold compound is directly coupled over the metal layer.

5. The semiconductor device of claim 1, wherein a surface of the contact pad facing away from the die is coplanar with a surface of a passivation layer facing away from the die.

6. A semiconductor device comprising:
    a die comprising a first side and a second side;
    a contact pad coupled to the first side of the die;
    a metal layer coupled to the second side of the die; and
    a mold compound directly coupled to and over an entire first surface of the metal layer opposite a second surface of the metal layer facing the second side of the die;
    wherein an outer sidewall of the mold compound comprises a step;
    wherein the die is singulated from a wafer;
    wherein the mold compound covers and contacts an outermost sidewall of the metal layer;
    wherein an outer sidewall of the die is coplanar with an outermost sidewall of the mold compound; and
    wherein a perimeter of an entirety of the metal layer is less than and lies within a perimeter of the die.

7. The device of claim 6, wherein a thickness of the die is substantially the same as a thickness of the metal layer.

8. The device of claim 6, wherein a thickness of the die is no more than four times a thickness of the metal layer.

9. The device of claim 6, wherein the step surrounds an outermost sidewall of the metal layer.

10. The semiconductor wafer of claim 6, wherein a surface of the contact pad facing away from the die is coplanar with a surface of a passivation layer facing away from the die.

11. A semiconductor wafer comprising:
    a wafer comprising a first side and a second side, the wafer comprising a plurality of die;
    a plurality of contact pads coupled to the first side of the wafer;
    a metal layer coupled within a recess comprised in the second side of the wafer; and
    a mold compound coupled directly to and over the metal layer;
    wherein a portion of the wafer is coplanar with a plane formed by a portion of the mold compound facing away from the metal layer;
    wherein the metal layer is patterned by a plurality of openings extending through the metal layer;
    wherein the mold compound fills the plurality of openings; and
    wherein the mold compound comprises a plurality of recesses over each opening of the plurality of openings.

12. The semiconductor wafer of claim 11, wherein a thickness of the wafer is less than 30 micrometers.

13. The semiconductor wafer of claim 11, wherein the mold compound covers an entire first surface of the metal layer opposite a second surface of the metal layer facing the second side of the wafer.

14. The semiconductor wafer of claim 11, further comprising a plurality of bumps coupled over the metal layer.

15. The semiconductor wafer of claim 11, further comprising a conductive layer coupled between the plurality of contact pads and the wafer.

16. The semiconductor wafer of claim 11, further comprising a second metal layer coupled over the metal layer.

17. The semiconductor wafer of claim 11, wherein a thickness of the metal layer is substantially three times a thickness of the wafer.

18. The semiconductor wafer of claim 11, wherein the plurality of contact pads are exposed through a passivation layer coupled over the wafer.

19. The semiconductor wafer of claim 18, wherein a surface of the contact pads facing away from the wafer is coplanar with a surface of the passivation layer facing away from the wafer.

20. The semiconductor wafer of claim 11, further comprising a seed layer directly coupled to the wafer within the recess.

* * * * *